United States Patent
Li et al.

(10) Patent No.: US 10,573,245 B2
(45) Date of Patent: Feb. 25, 2020

(54) SHIFT REGISTER UNIT USING A BOOTSTRAP EFFECT AND DRIVING METHOD THEREOF, SHIFT REGISTER AND DISPLAY DEVICE

(71) Applicant: BOE Technology Group Co., Ltd., Beijing (CN)

(72) Inventors: Quanhu Li, Beijing (CN); Yongqian Li, Beijing (CN); Song Meng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 185 days.

(21) Appl. No.: 15/537,724

(22) PCT Filed: Oct. 18, 2016

(86) PCT No.: PCT/CN2016/102343
§ 371 (c)(1),
(2) Date: Jun. 19, 2017

(87) PCT Pub. No.: WO2017/067432
PCT Pub. Date: Apr. 27, 2017

(65) Prior Publication Data
US 2018/0277043 A1    Sep. 27, 2018

(30) Foreign Application Priority Data

Oct. 23, 2015 (CN) .......................... 2015 1 0696697

(51) Int. Cl.
*G09G 3/3266* (2016.01)
*G11C 19/28* (2006.01)
(Continued)

(52) U.S. Cl.
CPC ......... *G09G 3/3266* (2013.01); *G09G 3/3674* (2013.01); *G09G 3/3677* (2013.01);
(Continued)

(58) Field of Classification Search
CPC .. G09G 3/3266; G09G 3/3611; G09G 3/3674; G09G 3/3677; G09G 2310/0267;
(Continued)

(56) References Cited

U.S. PATENT DOCUMENTS 8,922,471 B2 * 12/2014 Chung ................... G09G 3/003
345/98
2008/0226013 A1 * 9/2008 Deane .................... G11C 19/00
377/70
(Continued)

FOREIGN PATENT DOCUMENTS

CN        102024500 A    4/2011
CN        102237034 A    11/2011
(Continued)

OTHER PUBLICATIONS

Jan. 24, 2017—(WO) International Search Report and Written Opinion Appn PCT/CN2016/102343 with English Tran.
(Continued)

*Primary Examiner* — Keith L Crawley
(74) *Attorney, Agent, or Firm* — Banner & Witcoff, Ltd.

(57) ABSTRACT

A shift register unit and a driving method thereof, shift register and display device. The shift register unit including an input circuit (P1), a pull-down control circuit (P2), a pull-up control circuit (P3), a pull-up circuit (P4) and a pull-down circuit (P5); wherein the input circuit (P1) is connected to a first trigger signal end (STU), a first clock signal end (CLK1), a power level end (VGL) and a pull-up control node (Q), and is for utilizing a bootstrap effect to transfer a signal of the first trigger signal end (STU) to the pull-up control node (Q) without a threshold voltage loss. The shift register unit is for use in a display device, and
(Continued)

resolves the problem of a display device having a non-uniform display, resulting in a poor displaying effect of a display device.

17 Claims, 4 Drawing Sheets

(51) Int. Cl.
    *G11C 19/18*     (2006.01)
    *G09G 3/36*     (2006.01)

(52) U.S. Cl.
    CPC ............ *G11C 19/184* (2013.01); *G11C 19/28* (2013.01); *G09G 2310/0286* (2013.01); *G09G 2310/06* (2013.01); *G09G 2310/08* (2013.01); *G09G 2320/0233* (2013.01); *G09G 2320/045* (2013.01)

(58) Field of Classification Search
    CPC ....... G09G 2310/0286; G09G 2310/06; G09G 2310/08; G09G 2320/0233; G09G 2320/045; G11C 19/18; G11C 19/182; G11C 19/184; G11C 19/28
    See application file for complete search history.

(56) References Cited

U.S. PATENT DOCUMENTS

| | | | | |
|---|---|---|---|---|
| 2010/0060561 A1* | 3/2010 | Deane | .................. | G09G 3/3677 345/100 |
| 2013/0093743 A1* | 4/2013 | Takahashi | ............ | G09G 3/3677 345/211 |
| 2014/0176410 A1* | 6/2014 | Ma | ....................... | G09G 3/3622 345/92 |
| 2015/0029082 A1 | 1/2015 | Jeon et al. | | |
| 2015/0042689 A1 | 2/2015 | Kim et al. | | |
| 2015/0131771 A1* | 5/2015 | Hu | ........................... | G09G 3/20 377/68 |
| 2016/0140926 A1* | 5/2016 | Xiao | .................... | G09G 3/3677 345/215 |
| 2016/0253975 A1* | 9/2016 | Yang | ...................... | G11C 19/28 345/58 |
| 2016/0253977 A1* | 9/2016 | Ohkawa | ............... | G09G 3/3677 345/213 |

FOREIGN PATENT DOCUMENTS

| | | |
|---|---|---|
| CN | 102270434 A | 12/2011 |
| CN | 103050106 A | 4/2013 |
| CN | 103578560 A | 2/2014 |
| CN | 105185294 A | 12/2015 |
| JP | 2014007739 A | 1/2014 |
| KR | 20140139757 A | 12/2014 |
| TW | 201009797 A | 3/2010 |

OTHER PUBLICATIONS

May 4, 2017—(CN) First Office Action Appn 201510696697.5 with English Tran.

* cited by examiner

SHIFT REGISTER UNIT USING A BOOTSTRAP EFFECT AND DRIVING METHOD THEREOF, SHIFT REGISTER AND DISPLAY DEVICE

The application is a U.S. National Phase Entry of International Application No. PCT/CN2016/102343 filed on Oct. 18, 2016, designating the United States of America and claiming priority to Chinese Patent Application No. 201510696697.5 filed on Oct. 23, 2015. The present application claims priority to and the benefit of the above-identified applications and the above-identified applications are incorporated by reference herein in their entirety.

TECHNICAL FIELD

The present disclosure relates to a shift register unit and a driving method thereof, a shift register, and a display device.

BACKGROUND

When a display device performs displaying, it needs to utilize a shift register to realize scanning of a pixel unit. The shift register comprises a plurality of shift register units, each of which is corresponding to one row of pixel units and provides a gate drive signal for the pixel units. In this way, progressive scanning and driving of the pixel units of the display device is realized by the plurality of shift register units, so as to display an image.

However, an input module in the shift register unit comprises transistors. The transistors have threshold voltages, and the threshold voltages of the transistors of the input modules in the respective shift register units manufactured in the manufacturing process are often different. There occurs easily to transistors whose threshold voltages drift forwards under the effect of a trigger signal a phenomenon of being not fully turned on. The influence of the threshold voltage causes that time lengths that transistors of subsequent circuits in the respective shift register units are turned on fully are different. Therefore, duration length of a rising edge or a falling edge of a gate drive signal output by the respective shift register units is different, thereby causing a non-uniform display of the display device. In the scenario that the threshold voltage drifts forwards very severely, the transistors of the subsequent circuits cannot even be turned on, so that display effect of the display device is reduced.

SUMMARY

There are provided in some embodiments of the present disclosure a shift register unit and a driving method thereof, a shift register and a display device, which are used for ensuring uniform display of the display device and raising display effect of the display device.

According to a first aspect of the present disclosure, there is provided a shift register unit, comprising an input circuit, a pull-down control circuit, a pull-up control circuit, a pull-up circuit and a pull-down circuit;

wherein the input circuit is connected to a first trigger signal end, a first clock signal end, a low level end and a pull-up control node, the input circuit is configured to transmit a signal of the first trigger signal end to a pull-up control node by a bootstrap effect without threshold voltage loss, and the pull-up control node is a connection point of the input circuit, the pull-up control circuit, the pull-down control circuit and the pull-up circuit;

the pull-down control circuit is connected to the first clock signal end, the pull-up control node, a pull-down control node and the low level end, the pull-down control circuit is configured to control a signal of the pull-down control node as a high level signal or a low level signal according to a signal of the first clock signal end and a signal of the pull-up control node, and the pull-down control node is a connection point of the pull-down control circuit, the pull-up control circuit and the pull-down circuit;

the pull-up control circuit is connected to a second trigger signal end, the low level end, the pull-up control node, the pull-down control node, and an output terminal of the shift register unit, and the pull-up control circuit is configured to control the signal of the pull-up control node as the high level signal or the low level signal according to a signal of the second trigger end and the bootstrap effect;

the pull-up circuit is connected to the first clock signal end, the pull-up control node and the output terminal of the shift register unit, and the pull-up circuit is configured to pull up a signal of the output terminal of the shift register unit as the high level signal under control of the signal of the pull-up control node and the signal of the first clock signal end; and the pull-down circuit is connected to the second trigger signal end, the low level end, a second clock signal end, the pull-down control node, and the output terminal of the shift register unit, and the pull-down circuit is configured to pull down the signal of the output terminal of the shift register unit as the low level signal under control of the signal of the pull-down control node, the signal of the second trigger signal end and a signal of the second clock signal end.

According to a second aspect of the present disclosure, there is provided a driving method of a shift register unit, which is used to drive the shift register unit as described in the above technical solution, the driving method comprising:

in a first phase, making both a signal of a first trigger signal end and a signal of a second clock signal end as a high level signal, and making both a signal of a second trigger signal end and a signal of a first clock signal end as a low level signal; transmitting, by an input circuit, the high level signal of the first trigger signal end to a pull-up control node by using a bootstrap effect without a threshold voltage loss; transmitting, by a pull-up circuit, a low level signal of the first clock signal end to an output terminal of the shift register unit under the control of a high level signal of the pull-up control node and the low level signal of the first clock signal end; and outputting the low level signal at the output terminal of the shift register unit;

in a second phase, making both the signal of the first trigger signal end, the signal of the second clock signal end and the signal of the second trigger signal end as the low level signal, and making the signal of the first clock signal end as the high level signal; controlling, by a pull-up control circuit, the signal of the pull-up control node as the high level signal by using the bootstrap effect; pulling up, by the pull-up circuit, the signal of the output terminal of the shift register unit as the high level signal under the control of the high level signal of the pull-up control node and the high level signal of the first clock signal end;

in a third phase, making both the signal of the first trigger signal end and the signal of the first clock signal end as the low level signal, and making the signal of the second trigger signal end and the signal of the second clock signal end as the high level signal; controlling, by the pull-up control circuit, the signal of the pull-up control node as the low level signal according to the high level signal of the second trigger signal end; and pulling down, by the pull-down circuit, the signal of the output terminal of the shift register unit as the low level signal under the control of the high level signal of the second trigger signal end and the high level signal of the second clock signal end;

in a fourth phase, making the signal of the first trigger signal end, the signal of the second clock signal end and the signal of the second trigger signal end as the low level signal, and making the signal of the first clock signal end as the high level signal; controlling, by a pull-down control circuit, a signal of a pull-down control node as the high level signal under the control of the high level signal of the first clock signal end and the low level signal of the pull-up control node; and pulling down, by the pull-down circuit, the signal of the output terminal of the shift register unit as the low level signal under the control of the high level signal of the pull-down control node;

in a fifth phase, making the signal of the first trigger signal end, the signal of the first clock signal end and the signal of the second trigger signal end as the low level signal, and the signal of the second clock signal end as the high level signal; and pulling down, by the pull-down circuit, the signal of the output terminal of the shift register unit as the low level signal under the control of the high level signal of the second clock signal end.

According to a third aspect, there is provided a shift register, comprising multiple stages of shift register units as described in the above technical solutions.

According to a fourth aspect, there is provided a display device, comprising the shift register as described in the above technical solution.

The shift register unit, and the driving method thereof, the shift register and the display device provided in the present disclosure comprise the input circuit, the pull-down control circuit, the pull-up control circuit, the pull-up circuit and the pull-down circuit. Compared with the shift register unit in the prior art of which the subsequent circuits are influenced by the threshold voltage of the input circuit, the input circuit in the shift register unit of the present disclosure is capable of raising the voltage of the input terminal of the input circuit greatly by using the bootstrap effect, which makes that the voltage of the input terminal of the input circuit is far greater than the threshold voltage of the transistors in the input circuit, so that the input circuit is capable of transmitting the signal of the first trigger signal end to the pull-up control node without a threshold voltage loss. In this way, the subsequent circuits in the shift register unit are not influenced by the threshold voltage of the transistors in the input circuit, thereby ensuring that the transistors in the subsequent circuits in the respective shift register units are capable of being turned on fully and quickly, so that the duration length of the rising edge or the falling edge of the gate drive signals output by the respective shift register unit are basically the same, so that uniform display of the display device is guaranteed, the subsequent circuits are capable of transmitting signals normally, and the display effect of the display device is improved.

DETAILED DESCRIPTION

In order to further describe a shift register unit, a driving method, a shift register and a display device thereof provided in embodiments of the present disclosure. Detailed descriptions are given below by combing with the figures of the specification.

Figure 1:
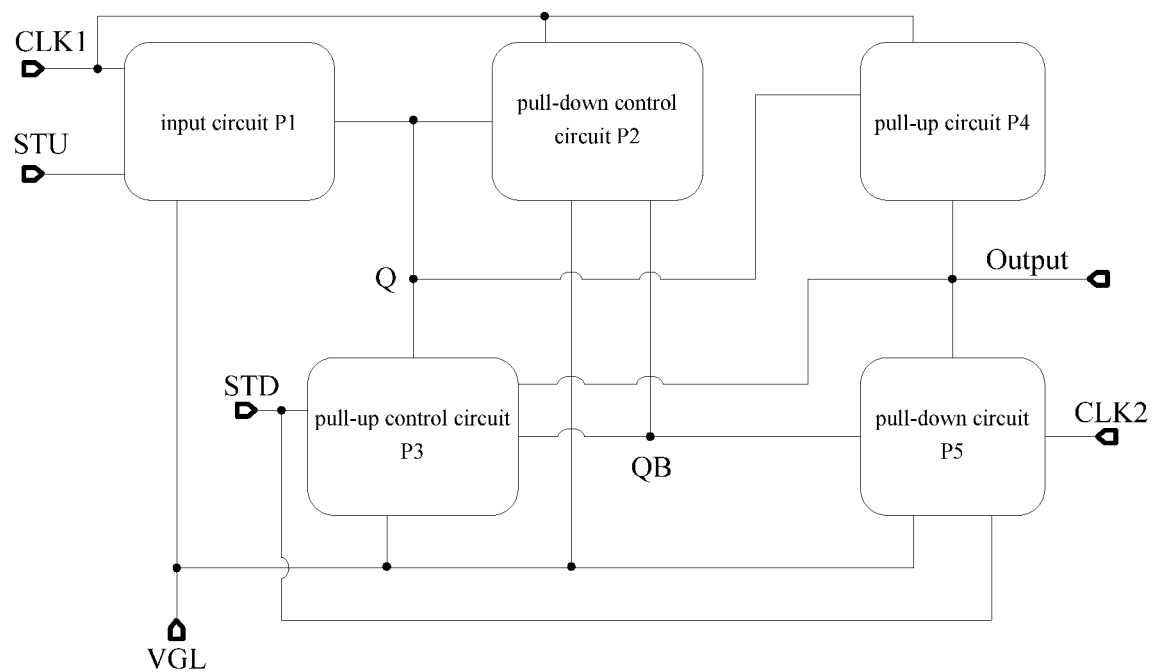
FIG. 1 is a structure schematic diagram of a shift register unit of one embodiment of the present disclosure.

FIG. 1 shows a structure schematic diagram of a shift register unit in one embodiment of the present disclosure. Referring to FIG. 1, the shift register unit provided in the embodiment of the present disclosure comprises an input circuit P1, a pull-down control circuit P2, a pull-up control circuit P3, a pull-up circuit P4 and a pull-down circuit P5. Herein, the input circuit P1 is connected to a first trigger signal end STU, a first clock signal end CLK1, and a low level end VGL and a pull-up control node Q. The input circuit P1 is configured to transmit a signal of the first trigger signal end STU to the pull-up control node Q without a loss of threshold voltage $V_{th}$ by using a bootstrap effect. If voltages of both a gate turn-on signal and a first electrode turn-on signal of a transistor in the input circuit are V1 (a high level signal), and voltages of both a gate turn-off signal and a first electrode turn-off signal of the transistor in the input circuit are V2 (a low level signal), then a voltage of a signal transmitted to the pull-up control node is $V1-V_{th}$. In general, when a threshold voltage of the transistor in the input circuit changes, the signal transmitted to the pull-up control node Q is fluctuated. In the shift register unit of the embodiment of the present disclosure, the input circuit P1 can raise a voltage of an input terminal of the input circuit P1 to about 2V1-V2 by using its own bootstrap effect (this voltage value is a theoretical value, being influenced by other factors, this voltage value is possible to fluctuate up and down, but would not affect the effect of the circuit of the shift register unit in the embodiment of the present disclosure). The voltage 2V1-V2 of the input terminal of the input circuit P1 is far greater than $V1+V_{th}$, such that the subsequent circuits of the shift register unit are not influenced by the threshold voltage $V_{th}$ of the transistor in the input circuit P1, and the voltage of the high level signal of the pull-up control node Q is V1. Herein, the pull-up control node Q is a connection point of the input circuit P1, the pull-up control circuit P3, the pull-down control circuit P2 and the pull-up circuit P4.

The pull-down control circuit P2 is connected to the first clock signal end CLK1, the pull-up control node Q, a pull-down control node QB, and the low level end VGL. The pull-down control circuit P2 is configured to control the signal of the pull-down control node QB to be the high level signal or the low level signal according to the signal of the first clock signal end CLK1 and the signal of the pull-up control node Q. Herein, the pull-down control node QB is a connection point of the pull-down control circuit P2, the pull-up control circuit P3 and the pull-down circuit P5.

The pull-up control circuit P3 is connected to a second trigger signal end STD, the low level end VGL, the pull-up control node Q, the pull-down control node QB, the pull-down circuit P5 and an output terminal Output of the shift register unit. The pull-up control circuit P3 is configured to control the signal of the pull-up control node Q to be the high level signal or the low level signal by using the bootstrap effect according to a signal of the second trigger signal end STD.

The pull-up circuit P4 is connected to the first clock signal end CLK1, the pull-up control node Q and the output terminal Output of the shift register unit. The pull-up circuit P4 is configured to pull up the signal of the output terminal Output of the shift register unit to the high level signal under the control of the signal of the pull-up control node Q and the signal of the first clock signal end CLK1.

The pull-down circuit P5 is connected to the second trigger signal end STD, the low level end VGL, the second clock signal end CLK2, the pull-down control node QB and the output terminal Output of the shift register unit. The pull-down circuit P5 is configured to pull down the signal of the output terminal Output of the shift register unit to the low level signal under the control of the signal of the pull-down control node QB, the signal of the second trigger signal end STD and the signal of the second clock signal end CLK2.

Figure 2:
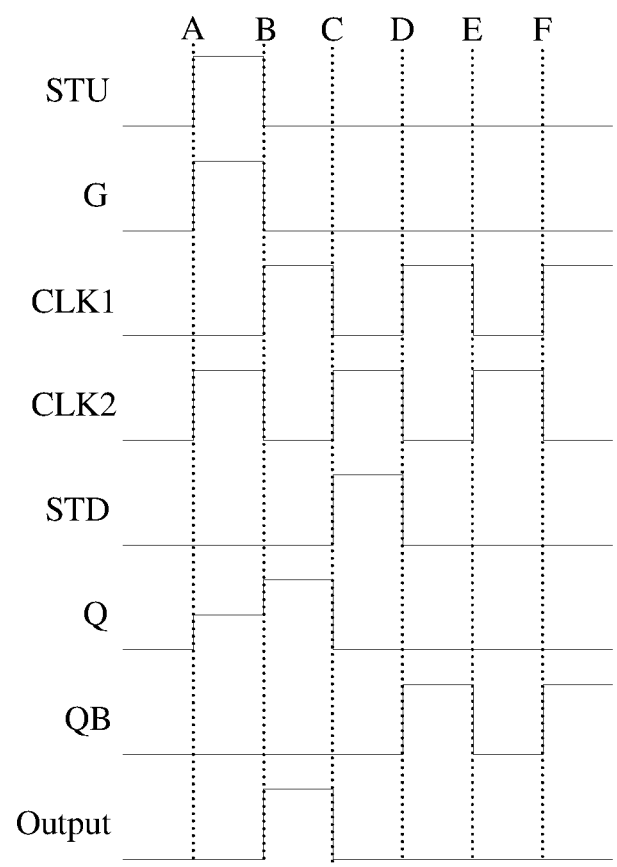
FIG. 2 is a signal timing diagram corresponding to FIGS. 1 and 4.

FIG. 2 shows a signal timing diagram corresponding to the shift register unit as described above. A driving method of the shift register unit will be described by combining with the shift register unit and referring to FIG. 2. The driving method of the shift register unit comprises following operation processes:

In a first phase (i.e., time periods A-B), both the signal of the first trigger signal end STU and the signal of the second clock signal end CLK2 are the high level signal, and both the signal of the second trigger signal end STD and the signal of the first clock signal end CLK1 are the low level signal. At this time, the input circuit P1 greatly increases the voltage of the signal of the input terminal of the input circuit P1 by using its own bootstrap effect. The increased voltage of the signal of the input terminal of the input circuit P1 is basically not influenced by the threshold voltage $V_{th}$ of the transistor in the input circuit P1, and is capable of transmitting the high level signal of the first trigger signal end STU to the pull-up control node Q without a loss of threshold voltage $V_{th}$.

Figure 3:
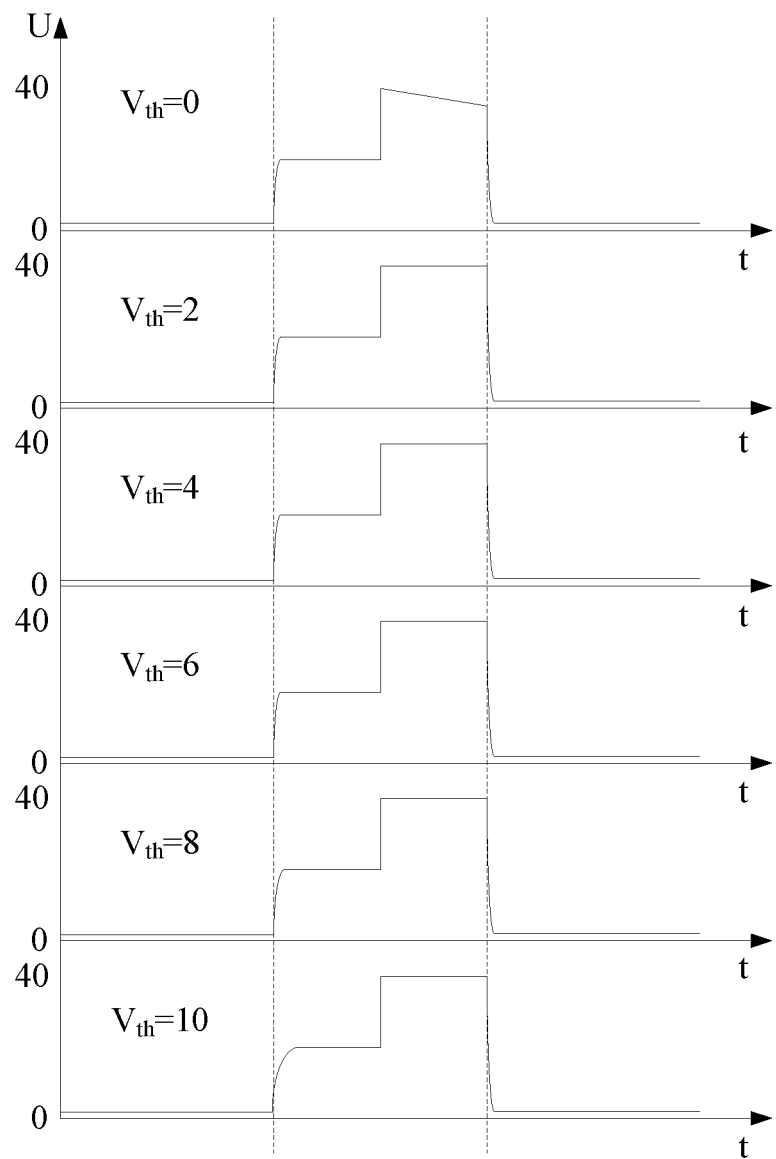
FIG. 3 is a signal timing diagram of a pull-up control node at different threshold voltages in an embodiment of the present disclosure.

FIG. 3 shows a signal timing diagram of the pull-up control node at different threshold voltages in an embodiment of the present disclosure. Referring to FIG. 3, FIG. 3 is a voltage simulation diagram of the pull-up control node Q in the shift register unit. The longitudinal axis represents voltage, and the horizontal axis represents time. When the threshold voltages $V_{th}$ of the transistors in the input circuit P1 are 0, 2V, 4V, 6V, 8V and 10V respectively, the voltage of the signal of the pull-up control node Q is not influenced. The pull-up circuit P4 transmits the low level signal of the first clock signal end CLK1 to the output terminal Output of the shift register unit under the control of the high level signal of the pull-up control node Q and the low level signal of the first clock signal end CLK1. At this time, the output terminal Output of the shift register unit outputs the low level signal.

Returning to FIG. 2, in a second phase (i.e., time periods B-C), the signal of the first trigger signal end STU, the signal of the second clock signal end CLK2 and the signal of the second trigger signal end STD are the low level signal, and the signal of the first clock signal end CLK1 is the high level signal. At this time, the pull-up control circuit P3 controls the signal of the pull-up control node Q to be the high level signal by using the bootstrap effect. The pull-up circuit P4 pulls up the signal of the output terminal Output of the shift register unit to the high level signal under the control of the high level signal of the pull-up control node Q and the high level signal of the first clock signal end CLK1.

In a third phase (i.e., time periods C-D), both the signal of the first trigger signal end STU and the signal of the first clock signal end CLK1 are the low level signal, and both the signal of the second trigger signal end STD and the signal of the second clock signal end CLK2 are the high level signal. At this time, the pull-up control circuit P3 controls the signal of the pull-up control node Q to be the low level signal according to the high level signal of the second trigger signal end STD. The pull-down circuit P5 pulls down the signal of the output terminal Output of the shift register unit to the low level signal under the control of the high level signal of the second trigger signal end STD and the high level signal of the second clock signal end CLK2.

In a fourth phase (i.e., periods of time D-E), the signal of the first trigger signal end STU, the signal of the second clock signal end CLK2 and the signal of the second trigger signal end STD are the low level signal, and the signal of the first clock signal end CLK1 is the high level signal. At this time, the pull-down control circuit P2 controls the signal of the pull-down control node QB to be the high level signal according to the high level signal of the first clock signal end CLK1 and the low level of the pull-up control node Q. The pull-down circuit P5 pulls down the signal of the output terminal Output of the shift register unit to the low level signal under the control of the high level signal of the pull-down control node QB.

In a fifth period (time periods E-F), the signal of the first trigger signal end STU, the signal of the first clock signal end CLK1 and the signal of the second trigger signal end STD are the low level signal, and the signal of the second clock end CLK2 is the high level signal. At this time, the pull-down circuit P5 pulls down the signal of the output terminal Output of the shift register unit to the low level signal under the control of the high level signal of the second clock signal end CLK2.

The shift register unit, and the driving method thereof provided in the present disclosure comprise the input circuit P1, the pull-down control circuit P2, the pull-up control circuit P3 and the pull-down circuit P5. Compared with the shift register unit in the prior art of which the subsequent circuits are influenced by the threshold voltage $V_{th}$ of the input circuit P1, the input circuit P1 in the shift register unit of the present disclosure is capable of greatly raising the voltage of the input terminal of the input circuit P1 by using the bootstrap effect, which makes that the voltage of the input terminal of the input circuit P1 is far greater than the threshold voltage $V_{th}$ of the transistors in the input circuit P1, so that the input circuit P1 is capable of transmitting the signal of the first trigger signal end STU to the pull-up control node Q without a loss of threshold voltage $V_{th}$. In this way, the subsequent circuits in the shift register unit are not influenced by the threshold voltage $V_{th}$ of the transistors in the input circuit P1, thereby ensuring that the transistors in the subsequent circuits of the respective shift register units are capable of being turned on fully and quickly, so that the duration length of the rising edge or the falling edge of the gate drive signal output by the respective shift register unit is basically the same, thereby ensuring that display of the display device is uniform, the subsequent circuits are capable of transmitting signals normally, and the display effect of the display device is improved.

Figure 4:
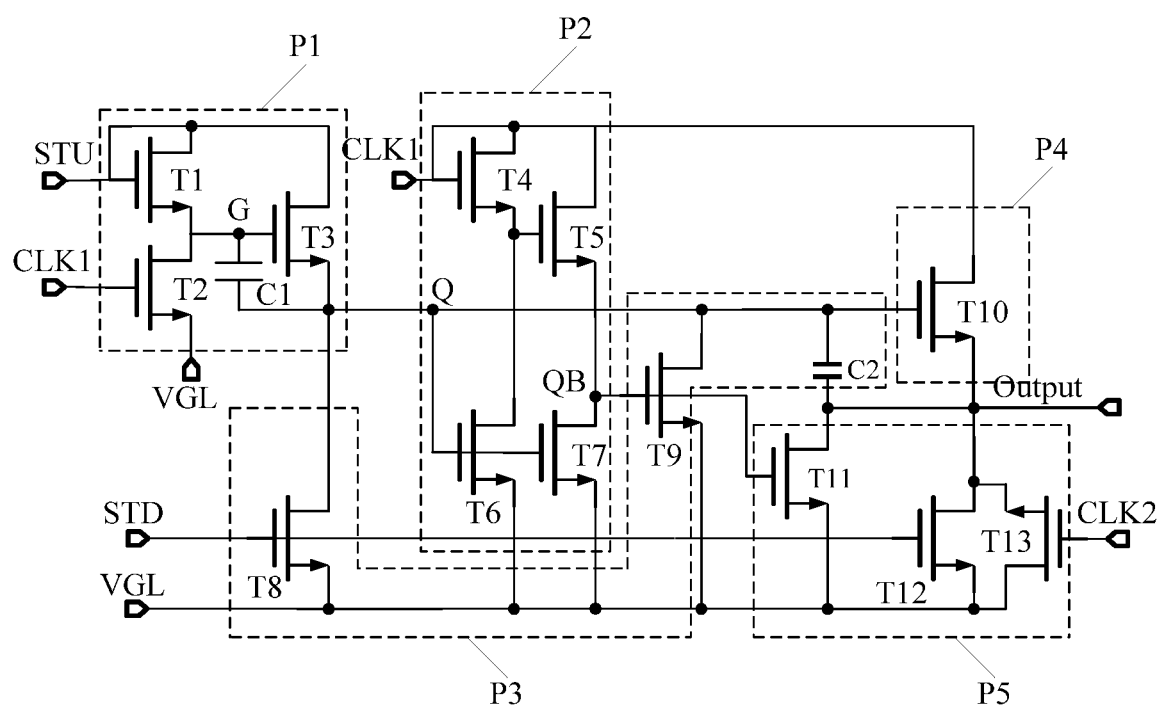
FIG. 4 is a structure schematic diagram of a shift register unit in another embodiment of the present disclosure.

FIG. 4 shows a structure schematic diagram of a shift register unit of another embodiment of the present disclosure. Referring to FIG. 4, specific structures of the input circuit P1, the pull-down control circuit P2, the pull-up control circuit P3, the pull-down circuit P4 and the pull-down circuit P5 in the above embodiment of the present disclosure will be described in detail below.

For example, the input circuit P1 comprises a first transistor T1, a second transistor T2, a third transistor T3 and a first capacitor C1.

As shown in FIG. 4, a gate of the first transistor T1 is connected to the first trigger signal end STU, a first electrode thereof is connected to a second electrode of the second transistor T2 and a first electrode of the first capacitor C1, and a second electrode thereof is connected to the first trigger signal end STU.

A gate of the second transistor T2 is connected to the first clock signal end CLK1, a first electrode thereof is connected to the low level end VGL, and the second electrode thereof is connected to the first electrode of the first capacitor C1.

A gate of the third transistor T3 is connected to the first electrode of the first capacitor C1, a first electrode thereof is connected to the pull-up control node Q and a second electrode of the first capacitor C1, and a second electrode thereof is connected to the first trigger signal end STU.

The second electrode of the first capacitor C1 is connected to the pull-up control node Q.

It needs to node that the first capacitor C1 herein may be a capacitor added between the gate of the third transistor T3 and the first electrode of the third transistor T3, or may be a parasitic capacitor of the third transistor T3 or a capacitor existing in other manners. The design of utilizing the bootstrap effect of the capacitor in the input circuit P1 to realize the purpose of transmitting the signal of the first trigger signal end STU to the pull-up control node Q without a loss of threshold voltage Vth falls into the protection scope of the present disclosure.

In FIG. 4, the pull-down control circuit P2 comprises a fourth transistor T4, a fifth transistor T5, a sixth transistor T6 and a seventh transistor T7.

A gate of the fourth transistor T4 is connected to the first clock signal end CLK1, a first electrode thereof is connected to a gate of the fifth transistor T5 and a second electrode of the sixth transistor T6, and a second electrode thereof is connected to the first clock signal end CLK1.

The gate of the fifth transistor T5 is connected to the second electrode of the sixth transistor T6, a first electrode thereof is connected to a second electrode of the seventh transistor T7 and the pull-down control node QB, and a second electrode thereof is connected to the first clock signal end CLK1.

A gate of the sixth transistor T6 is connected to the pull-up control node Q, and a first electrode thereof is connected to the low level end VGL.

A gate of the seventh transistor T7 is connected to the pull-up control node Q, a first electrode thereof is connected to the low level end VGL, and the second electrode thereof is connected to the pull-down control node QB.

The pull-up control circuit P3 comprises an eighth transistor T8, a ninth transistor T9 and a second capacitor C2. Herein, a gate of the eighth transistor T8 is connected to the second trigger signal end STD, a first electrode thereof is connected to the low level end VGL, and a second electrode thereof is connected to the pull-up control node Q.

A gate of the ninth transistor T9 is connected to the pull-down control node QB, a first electrode thereof is connected to the low level end VGL, and a second electrode thereof is connected to a first electrode of the second capacitor C2, and the pull-up control node Q.

The first electrode of the second capacitor C2 is connected to the pull-up control node Q, and a second electrode thereof is connected to the pull-down circuit P5 and the output terminal Output of the shift register unit.

The pull-up circuit P4 comprises a tenth transistor T10. A gate of the tenth transistor T10 is connected to the pull-up control node Q, a first electrode thereof is connected to the output terminal Output of the shift register unit, and a second electrode thereof is connected to the first clock signal end CLK1.

The pull-down circuit P5 comprises an eleventh transistor T11, a twelfth transistor T12 and a thirteenth transistor T13. Herein, a gate of the eleventh transistor T11 is connected to the pull-down control node QB, a first electrode thereof is connected to the low level end VGL, and a second electrode thereof is connected to the output terminal Output of the shift register unit.

A gate of the twelfth transistor T12 is connected to the second trigger signal end STD, a first electrode thereof is connected to the low level end VGL, and a second electrode thereof is connected to a first electrode of the thirteenth transistor T13 and the output terminal of the shift register.

A gate of the thirteenth transistor T13 is connected to the second clock signal end CLK2, the first electrode thereof is connected to the output terminal of the shift register, and a second electrode thereof is connected to the low level end VGL.

Exemplarily, the pull-up control node Q is a connection point of the first electrode of the third transistor T3, the second electrode of the first capacitor C1, the gate of the sixth transistor T6, the gate of the seventh transistor T7, the second electrode of the eighth transistor T8, the second electrode of the ninth transistor T9, the first electrode of the second capacitor C2 and the gate of the tenth transistor T10; and the pull-down control node QB is a connection point of the first electrode of the fifth transistor T5, the second electrode of the seventh transistor T7, the gate of the ninth transistor T9 and the gate of the eleventh transistor T11.

The driving method of the shift register unit as shown in FIG. 4 will be described by taking the respective transistors being N type transistors as an example. Referring to FIG. 2, FIG. 2 is a signal timing diagram corresponding to the shift register unit as shown in FIG. 4.

In a first phase of the present embodiment (i.e., the time periods A-B as shown in FIG. 2): the gate of the first transistor T1 receives the high level signal of the first trigger signal end STU, so that the first transistor T1 is turned on; the gate of the second transistor T2 receives the low level signal of the first clock signal end CLK1, so that the second transistor T2 is turned off; the first capacitor C1 raises the voltage (i.e., voltage at the node G in FIG. 4) at the gate of the third transistor T3 by using its own bootstrap effect, and the third transistor T3 is fully turned on. It is assumed that both voltages of the gate turn-on signal and the first electrode turn-on signal of the third transistor T3 are V1 (high level signal), both voltages of the gate turn-off signal and the first electrode turn-off signal of the transistor in the input circuit are V2 (low level signal), the voltage of the signal transmitted to the pull-up control node is $V1-V_{th}$, and in the prior art, when the threshold voltage of the transistor in the input circuit changes, the signal transmitted to the pull-up control node is fluctuated. However, in the shift register unit in the embodiment of the present disclosure, the first capacitor C1 is capable of raising the voltage of the signal of the gate of the third transistor T3 to about 2V1-V2 by using its own bootstrap effect (this voltage value is a theoretical value, and this voltage value is possible to fluctuate up and down due to the effect of other factors, but it does not influence the circuit effect of the shift register unit in the present disclosure). The voltage 2V1-V2 of the signal of the gate of the third transistor T3 is far greater than $V1+V_{th}$, such that the subsequent circuits of the shift register would not be influenced by the threshold voltage $V_{th}$ of the transistor in the input circuit P1, and the voltage of the high level signal of the pull-up control node Q is V1, that is, the high level signal of the first trigger signal end STU is transmitted to the pull-up control node Q without threshold voltage $V_{th}$ loss through the third transistor T3;

The gate of the fourth transistor T4 receives the low level signal of the first clock signal end CLK1, so that the fourth transistor T4 is turned off; the gate of the sixth transistor T6 and the gate of the seventh transistor T7 receive the high level signal of the pull-up control node Q, so that both the sixth transistor T6 and the seventh transistor T7 are turned on; the low level signal of the low level end VGL is transmitted to the gate of the fifth transistor T5 through the sixth transistor T6, so that the fifth transistor T5 is turned off; the low level signal of the low level end VGL is transmitted to the pull-down control node QB through the seventh transistor T7; the gate of the ninth transistor T9 and the gate of the eleventh transistor T11 receive the low level signal of the pull-down control node QB, so that both the ninth transistor T9 and the tenth transistor T10 are turned off; the gate of the eighth transistor T8 and the gate of the twelfth transistor T12 receive the low level signal of the second trigger signal end STD, so that both the eighth transistor T8 and the twelfth transistor T12 are turned off; the gate of the thirteen transistor T13 receive the high level signal of the first clock signal end CLK1, so that the thirteen transistor T13 is turned off, and the low level signal of the low level signal end is transmitted to the output terminal Output through the thirteenth transistor T13;

The gate of the tenth transistor T10 receives the high level signal of the pull-up control node Q, so that the tenth transistor T10 is turned on; the low level signal of the first clock signal end CLK1 is transmitted to the output terminal Output of the shift register unit through the tenth transistor T10; and the output terminal Output of the shift register outputs the low level signal.

In a second phase of the present embodiment (i.e., time periods B-C as shown in FIG. 2): the gate of the first transistor T1 receives the low level signal of the first trigger signal end STU, so that the first transistor T1 is turned off; the gate of the second transistor T2 receives the high level signal of the first trigger signal end CLK1, so that the second transistor T2 is turned on, and the low level signal of the low level end VGL is transmitted to the gate of the third transistor T3 through the second transistor T2, so that the third transistor T3 is turned off; the second capacitor C2 raises the signal of the pull-up control node Q to the high level signal by using its own bootstrap effect; the gate of the sixth transistor T6 and the gate of the seventh transistor T7 receive the high level signal of the pull-up control node Q, so that both the sixth transistor T6 and the seventh transistor T7 are turned on; the low level signal of the low level end VGL is transmitted to the gate of the fifth transistor T5 through the sixth transistor T6, so that the fifth transistor T5 is turned off; the low level signal of the low level end VGL is transmitted to the pull-down control node QB through the seventh transistor T7; the gate of the ninth transistor T9 and the gate of the eleventh transistor T11 receive the low level signal of the pull-down control node QB, so that both the ninth transistor T9 and the eleventh transistor T11 are turned off; the gate of the eighth transistor T8 and the gate of the twelfth transistor T12 receive the low level signal of the second trigger signal end STD, so that both the eighth transistor T8 and the twelfth transistor T12 are turned off; the gate of the thirteenth transistor T13 receives the low level signal of the first clock signal end CLK1, so that the thirteenth transistor T13 is turned off; the gate of the tenth transistor T10 receives the high level signal of the pull-up control node Q, so that the tenth transistor T10 is turned on; the high level signal of the first clock signal end CLK1 is transmitted to the output terminal Output of the shift register unit through the tenth transistor T10; and the signal of the output terminal of the shift register is pull up to the high level signal.

In a third phase of the present embodiment (i.e., time periods C-D as shown in FIG. 2): the gate of the first transistor T1 receives the low level signal of the first trigger signal end STU, so that the first transistor T1 is turned off; the gate of the second transistor T2 receives the low level signal of the first clock signal end CLK1, so that the second transistor T2 is turned off; thus, the signal of the gate of the third transistor T3 is also the low level signal, so that the third transistor T3 is turned off; the gate of the sixth transistor T6 and the gate of the seventh transistor T7 receive the low level signal of the pull-up control node Q, so that the sixth transistor T6 and the seventh transistor T7 are turned off; the gate of the fourth transistor T4 receives the low level signal of the first clock signal end CLK1, so that the fourth transistor T4 is turned off; thus, the fifth transistor T5 is turned off, the signal of the pull-down control node QB is the low level signal, and the gate of the ninth transistor T9 and the gate of the eleventh transistor T11 receive the low level signal of the pull-down control node QB, so that both the ninth transistor T9 and the eleventh transistor T11 are turned off; the gate of the thirteen transistor T13 receives the high level signal of the second clock signal end CLK2, so that the thirteenth transistor T13 is turned off, and the low level signal of the low level end VGL is transmitted to the output terminal Output of the shift register unit through the thirteenth transistor T13; the gate of the eighth transistor T8 and the gate of the twelfth transistor T12 receives the high level signal of the second trigger signal end STD, so that the eighth transistor T8 and the twelfth transistor T12 are turned on; the low level signal of the low level end VGL is transmitted to the pull-up control node Q through the eighth transistor T8, and the gate of the tenth transistor T10 receives the low level signal of the pull-up control node Q, so that the tenth transistor T10 is turned off; the low level signal of the low level end VGL is transmitted to the output terminal Output of the shift register unit through the twelfth transistor T12; and the signal of the output terminal Output of the shift register unit is pulled down to the low level signal.

In a fourth phase of the present embodiment (i.e., time periods D-E as shown in FIG. 2): the gate of the first transistor T1 receives the low level signal of the first trigger signal end STU, so that the first transistor T1 is turned off; the gate of the second transistor T2 receives the high level signal of the first clock signal end CLK1, so that the second transistor T2 is turned on, and the low level signal of the low level end VGL is transmitted to the gate of the third transistor T3 through the second transistor T2, so that the third transistor T3 is turned off; the gate of the eighth transistor T8 and the gate of the twelfth transistor T12 receive the low level signal of the second trigger signal end STD, so that the eight transistor T8 and the twelfth transistor T12 are turned off; the thirteenth transistor T13 receives the low level signal of the second clock signal end CLK2, so that the thirteen transistor T13 is turned off; the gate of the fourth transistor T4 receives the high level signal of the first clock signal end CLK1, so that the fourth transistor T4 is turned on; the high level signal of the first clock signal end CLK1 is transmitted to the gate of the fifth transistor T5 through the fourth transistor T4, so that the fifth transistor T5 is turned on; the high level signal of the first clock signal end CLK1 is transmitted to the pull-down control node QB through the fifth transistor T5; the gate of the ninth transistor T9 and the gate of the eleventh transistor T11 receive the high level signal of the pull-down control node QB, so that both the ninth transistor T9 and the eleventh transistor T11 are turned on; the low level signal of the low level end VGL is transmitted to the pull-up control node Q through the ninth transistor T9, the gate of the tenth transistor T10 receives the low level signal of the pull-up control node Q, so that the tenth transistor T10 is turned off; the low level signal of the low level end VGL is transmitted to the output terminal Output of the shift register unit through the eleventh transistor T11; and the signal of the output terminal Output of the shift register unit is pulled down to the low level signal.

In a fifth phase of the present embodiment (i.e., time periods E-F as shown in FIG. 2): the gate of the first transistor T1 receives the low level signal of the first trigger signal end STU, so that the first transistor T1 is turned off; the gate of the second transistor T2 receives the low level signal of the first clock signal end CLK1, so that the second transistor T2 is turned off; thus, the signal of the gate of the third transistor T3 is also the low level signal, so that the third transistor T3 is turned off; thus, the signal of the pull-up control node Q is the low level signal, and the gate of the tenth transistor T10 receives the low level signal of the pull-up control node Q, so that the tenth transistor T10 is turned off; the gate of the sixth transistor T6 and the gate of the seventh transistor T7 receive the low level signal of the pull-up control node Q, so that both the sixth transistor T6 and the seventh transistor T7 are turned off; the gate of the fourth transistor T4 receives the low level signal of the first clock signal end CLK1, so that the fourth transistor T4 is turned off; when the signal of the first clock signal end CLK1 jumps from the high level signal into the low level signal, due to influence of the parasitic capacitor of the fifth transistor T5, the gate of the fifth transistor T5 generates a signal slightly greater than the low level signal, so that the fifth transistor T5 is turned on slightly, and the low level signal of the first clock signal end CLK1 is transmitted to the pull-down control node QB through the fifth transistor T5; the gate of the eighth transistor T8 and the gate of the twelfth transistor T12 receive the low level signal of the second trigger signal end STD, so that the eighth transistor T8 and the twelfth transistor T12 are turned off; the gate of the thirteenth transistor T13 receives the high level signal of the twelfth clock signal end CLK2, so that the thirteenth transistor T13 is turned on; the low level signal of the low level end VGL is transmitted to the output terminal Output of the shift register unit through the thirteenth transistor T13; and the signal of the output terminal Output of the shift register unit is pulled down to the low level signal.

In particular, during the periods from the first period of time to the fifth period of time, the eleventh transistor T11 and the thirteenth transistor T13 would be alternatively turned on, so as to pull down the signal of the output terminal Output of the shift register unit to the low level signal alternatively. Alternative turning-on and operating of the eleventh transistor T11 and the thirteenth transistor T13 reduces the influence of electrical stress on the eleventh transistor T11 and the thirteenth transistor T13 and prolong the service time of the circuit.

It needs to note that first electrodes and second electrodes in the respective transistors in the embodiment of the present disclosure are sources and drains, to which the present disclosure does not limit. That is to say, when the first electrodes of the transistors are sources, the second electrodes of the transistors are drains; or, when the first electrodes of the transistors are the drains, the second electrodes of the transistors are the sources.

There is further provided in an embodiment of the present disclosure a shift register, comprising multiple stages of shift register units as described in the embodiment described above. The shift register unit in the shift register has the same advantages as the shift register unit in the embodiment as described above, and thus no further description is given herein.

There is further provided in an embodiment of the present disclosure a display device, comprising the shift register in the above embodiment. The shift register in the display device has the same advantages as the shift register in the embodiments as described above, and thus no further details are given herein. For example, the display device comprises any product or circuit having the function of displaying, such as a liquid crystal display panel, an OLED display panel, an electronic paper, a mobile phone, a tablet computer, a television set, a display, a notebook computer, a digital photo frame, a navigator, etc.

In the description of the above implementation, specific features, structures, materials or characteristics can be combined in an appropriate manner in one or more embodiments or examples.

The above descriptions are just specific implementations of the present disclosure, but the protection scope of the present disclosure does not limit thereto. Any alternation or replacement easily conceived by those skilled in the art who are familiar with the prior art within the technical scope disclosed in the present disclosure shall be covered into the protection scope. Therefore, the protection scope of the present disclosure shall be subjected to the protection scope of the claims.

The present application claims the priority of a Chinese patent application No. 201510696697.5 filed on Oct. 23, 2015. Herein, the content disclosed by the Chinese patent application is incorporated in full by reference as a part of the present disclosure.

What is claimed is:

1. A shift register unit, comprising:
   an input circuit, connected to a first trigger signal end, a first clock signal end, a low level end, and a pull-up control node, and configured to transmit a signal of the first trigger signal end to the pull-up control node by a bootstrap effect without a threshold voltage loss;
   a pull-down control circuit, connected to the first clock signal end, the pull-up control node, a pull-down control node, and the low level end and configured to control a signal of the pull-down control node to be a high level signal or a low level signal according to a signal of the first clock signal end and a signal of the pull-up control node;
   a pull-up control circuit, connected to a second trigger signal end, the low level end, the pull-up control node, the pull-down control node, and an output terminal of the shift register unit, and configured to control the signal of the pull-up control node to be the high level signal or the low level signal according to a signal of the second trigger signal end and the bootstrap effect;
   a pull-up circuit, connected to the first clock signal end, the pull-up control node, and the output terminal of the shift register unit, and configured to pull up a signal of the output terminal of the shift register unit as the high level signal under the control of the signal of the pull-up control node and the signal of the first clock signal end; and a pull-down circuit, connected to the second trigger signal end, the low level end, a second clock signal end, the pull-down control node, the pull-up control node, and the output terminal of the shift register unit, and configured to pull down the signal of the output terminal of the shift register unit as the low level signal according to the signal of the pull-down control node, the signal of the second trigger signal end, and a signal of the second clock signal end, wherein the pull-up control node is a connection point of the input circuit, the pull-up control circuit, the pull-down control circuit, and the pull-up circuit, and the pull-down control node is a connection point of the pull-down control circuit, the pull-up control circuit, and the pull-down circuit, wherein the input circuit comprises a first transistor, a second transistor, a third transistor, and a first capacitor;

a gate of the first transistor is connected to the first trigger signal end, a first electrode thereof is connected to a second electrode of the second transistor and a first electrode of the first capacitor, and a second electrode thereof is connected to the first trigger signal end;

a gate of the second transistor is directly connected to the first clock signal end, a first electrode thereof is connected to the low level end, and the second electrode thereof is connected to the first electrode of the first capacitor;

a gate of the third transistor is connected to the first electrode of the first capacitor, a first electrode thereof is directly connected to the pull-up control node and a second electrode of the first capacitor, and a second electrode thereof is directly connected to the first trigger signal end; and the second electrode of the first capacitor is directly connected to the pull-up control node.

2. The shift register unit according to claim 1, wherein the pull-down control circuit comprises a fourth transistor, a fifth transistor, a sixth transistor, and a seventh transistor;

a gate of the fourth transistor is connected to the first clock signal end, a first electrode thereof is connected to a gate of the fifth transistor and a second electrode of the sixth transistor, and a second electrode thereof is connected to the first clock signal end;

the gate of the fifth transistor is connected to the second electrode of the sixth transistor, a first electrode thereof is connected to a second electrode of the seventh transistor and the pull-down control node, and a second electrode thereof is connected to the first clock signal end;

a gate of the sixth transistor is connected to the pull-up control node, and a first electrode thereof is connected to the low level end; and a gate of the seventh transistor is connected to the pull-up control node, a first electrode thereof is connected to the low level end, and a second electrode thereof is connected to the pull-down control node.

3. The shift register unit according to claim 1, wherein the pull-up control circuit comprises an eighth transistor, a ninth transistor, and a second capacitor;

a gate of the eighth transistor is connected to the second trigger signal end, a first electrode thereof is connected to the low level end, and a second electrode thereof is connected to the pull-up control node;

a gate of the ninth transistor is connected to the pull-down control node, a first electrode thereof is connected to the low level end, and a second electrode thereof is connected to a first electrode of the second capacitor and the pull-up control node; and the first electrode of the second capacitor is connected to the pull-up control node, and a second electrode thereof is connected to the pull-down circuit and the output terminal of the shift register unit.

4. The shift register unit according to claim 1, wherein the pull-up circuit comprises a tenth transistor, wherein a gate of the tenth transistor is connected to the pull-up control node, a first electrode thereof is connected to the output terminal of the shift register unit, and a second electrode thereof is connected to the first clock signal end.

5. The shift register unit according to claim 1, wherein the pull-down circuit comprises a eleventh transistor, a twelfth transistor, and a thirteenth transistor;

a gate of the eleventh transistor is connected to the pull-down control node, a first electrode thereof is connected to the low level end, and a second electrode thereof is connected to the output terminal of the shift register unit;

a gate of the twelfth transistor is connected to the second trigger signal end, a first electrode thereof is connected to the low level end, and a second electrode thereof is connected to a first electrode of the thirteen transistor and the output terminal of the shift register unit; and a gate of the thirteenth transistor is connected to the second clock signal end, the first electrode thereof is connected to the output terminal of the shift register unit, and a second electrode thereof is connected to the low level end.

6. A driving method for driving a shift register unit, wherein the shift register unit comprises: an input circuit, connected to a first trigger signal end, a first clock signal end, a low level end, and a pull-up control node, and configured to transmit a signal of the first trigger signal end to the pull-up control node by a bootstrap effect without a threshold voltage loss: a pull-down control circuit, connected to the first clock signal end, the pull-up control node, a pull-down control node, and the low level end and configured to control a signal of the pull-down control node to be a high level signal or a low level signal according to a signal of the first clock signal end and a signal of the pull-up control node; a pull-up control circuit, connected to a second trigger signal end, the low level end, the pull-up control node, the pull-down control node, and an output terminal of the shift register unit, and configured to control the signal of the pull-up control node to be the high level signal or the low level signal according to a signal of the second trigger signal end and the bootstrap effect, a pull-up circuit, connected to the first clock signal end, the pull-up control node, and the output terminal of the shift register unit, and configured to pull up a signal of the output terminal of the shift register unit as the high level signal under the control of the signal of the pull-up control node and the signal of the first clock signal end; and a pull-down circuit, connected to the second trigger signal end, the low level end, a second clock signal end, the pull-down control node, the pull-up control node, and the output terminal of the shift register unit, and configured to pull down the signal of the output terminal of the shift register unit as the low level signal according to the signal of the pull-down control node, the signal of the second trigger signal end, and a signal of the second clock signal end, wherein the pull-up control node is a connection point of the input circuit, the pull-up control circuit, the pull-down control circuit, and the pull-up circuit, and the pull-down control node is a connection point of the pull-down control circuit, the pull-up control circuit, and the pull-down circuit, wherein the input circuit comprises a first transistor, a second transistor, a third transistor and a first capacitor;

a gate of the first transistor is connected to the first trigger signal end, a first electrode thereof is connected to a second electrode of the second transistor and a first electrode of the first capacitor, and a second electrode thereof is connected to the first trigger signal end, a gate of the second transistor is directly connected to the first clock signal end, a first electrode thereof is connected to the low level end, and the second electrode thereof is connected to the first electrode of the first capacitor;

a gate of the third transistor is connected to the first electrode of the first capacitor, a first electrode thereof is directly connected to the pull-up control node and a second electrode of the first capacitor, and a second electrode thereof is directly connected to the first trigger signal end; and the second electrode of the first capacitor is directly connected to the pull-up control node, the driving method comprising:

in a first phase, making both a signal of the first trigger signal end and a signal of the second clock signal end into the high level signal, and making both a signal of the second trigger signal end and a signal of the first clock signal end into the low level signal; transmitting, by the input circuit, the high level signal of the first trigger signal end to the pull-up control node by using the bootstrap effect without the threshold voltage loss; transmitting, by the pull-up circuit, a low level signal of the first clock signal end to the output terminal of the shift register unit under the control of a high level signal of the pull-up control node and the low level signal of the first clock signal end; and outputting the low level signal at the output terminal of the shift register unit;

in a second phase, making both the signal of the first trigger signal end, the signal of the second clock signal end, and the signal of the second trigger signal end into the low level signal, and making the signal of the first clock signal end into the high level signal; controlling, by the pull-up control circuit, the signal of the pull-up control node into the high level signal by using the bootstrap effect; pulling up, by the pull-up circuit, the signal of the output terminal of the shift register unit into the high level signal under the control of the high level signal of the pull-up control node and the high level signal of the first clock signal end;

in a third phase, making both the signal of the first trigger signal end and the signal of the first clock signal end into the low level signal, and making the signal of the second trigger signal end and the signal of the second clock signal end into the high level signal; controlling, by the pull-up control circuit, the signal of the pull-up control node to be the low level signal according to the high level signal of the second trigger signal end; and pulling down, by the pull-down circuit, the signal of the output terminal of the shift register unit into the low level signal under the control of the high level signal of the second trigger signal end and the high level signal of the second clock signal end;

in a fourth phase, making the signal of the first trigger signal end, the signal of the second clock signal end, and the signal of the second trigger signal end into the low level signal, and making the signal of the first clock signal end into the high level signal; controlling, by the pull-down control circuit, a signal of the pull-down control node to be the high level signal under the control of the high level signal of the first clock signal end and the low level signal of the pull-up control node; and pulling down, by the pull-down circuit, the signal of the output terminal of the shift register unit into the low level signal under the control of the high level signal of the pull-down control node;

in a fifth phase, making the signal of the first trigger signal end, the signal of the first clock signal end, and the signal of the second trigger signal end into the low level signal, and the signal of the second clock signal end into the high level signal; and pulling down, by the pull-down circuit, the signal of the output terminal of the shift register unit into the low level signal under the control of the high level signal of the second clock signal end.

7. The driving method according to claim 6, wherein the pull-down control circuit comprises a fourth transistor, a fifth transistor, a sixth transistor and a seventh transistor; the pull-up control circuit comprises an eighth transistor, a ninth transistor, and a second capacitor; the pull-up circuit comprises a tenth transistor; and the pull-down circuit comprises a eleventh transistor, a twelfth transistor, and a thirteenth transistor, the driving method further comprising: in the first phase:

making the first transistor turned on by receiving the high level signal of the first trigger signal end; raising a gate voltage of the third transistor through the first capacitor by using its own bootstrap effect, so that the third transistor is fully turned on; and transmitting the high level signal of the first trigger signal end to the pull-up control node without a threshold voltage loss through the third transistor;

making the tenth transistor turned on by receiving the high level signal of the pull-up control node; and transmitting the low level signal of the first clock signal end to the output terminal of the shift register unit through the tenth transistor; and outputting the low level signal at the output terminal of the shift register unit.

8. The driving method according to claim 7, further comprising: in the second phase:

raising the signal of the pull-up control node to the high level signal through the second capacitor by using its own bootstrap effect;

making the tenth transistor turned on by receiving the high level signal of the pull-up control node; and transmitting the high level signal of the first clock signal end to the output terminal of the shift register unit through the tenth transistor; and pulling up the signal of the output terminal of the shift register unit to the high level signal.

9. The driving method according to claim 7, further comprising: in the third phase:

making both the eighth transistor and the twelfth transistor turned on by receiving the high level signal of the second trigger signal end;

transmitting the low level signal of the low level end to the pull-up control node through the eighth transistor, and making the tenth transistor turned off by receiving the low level signal of the pull-up control node;

transmitting the low level signal of the low level end to the output terminal of the shift register unit through the twelfth transistor; and pulling down the signal of the output terminal of the shift register unit to the low level signal.

10. The driving method according to claim 7, further comprising: in the fourth phase:
   making the fourth transistor turned on by receiving the high level signal of the first clock signal end;
   transmitting the high level signal of the first clock signal end to the gate of the fifth transistor through the fourth transistor, so that the fifth transistor is turned on;
   transmitting the high level signal of the first clock signal end to the pull-down control node through the fifth transistor;
   making both the ninth transistor and the eleventh transistor turned on by receiving the high level signal of the pull-down control node;
   transmitting the low level signal of the low level end to the pull-up control node through the ninth transistor, and making the tenth transistor turned off by receiving the low level signal of the pull-up control node;
   transmitting the low level signal of the low level end to the output terminal of the shift register unit through the eleventh transistor; and
   pulling down the signal of the output terminal of the shift register unit as the low level signal.

11. The driving method according to claim 7, further comprising: in the fifth phase:
   making the thirteenth transistor turned on by receiving the high level signal of the second clock signal end;
   transmitting the low level signal of the low level end to the output terminal of the shift register unit through the thirteen transistor; and
   pulling down the output terminal of the shift register unit as the low level signal.

12. A shift register, comprising the shift register unit according to claim 1.

13. A display device, comprising the shift register according to claim 12.

14. The shift register according to claim 12, wherein the pull-down control circuit comprises a fourth transistor, a fifth transistor, a sixth transistor, and a seventh transistor;
   a gate of the fourth transistor is connected to the first clock signal end, a first electrode thereof is connected to a gate of the fifth transistor and a second electrode of the sixth transistor, and a second electrode thereof is connected to the first clock signal end;
   the gate of the fifth transistor is connected to the second electrode of the sixth transistor, a first electrode thereof is connected to a second electrode of the seventh transistor and the pull-down control node, and a second electrode thereof is connected to the first clock signal end;
   a gate of the sixth transistor is connected to the pull-up control node, and a first electrode thereof is connected to the low level end; and
   a gate of the seventh transistor is connected to the pull-up control node, a first electrode thereof is connected to the low level end, and a second electrode thereof is connected to the pull-down control node.

15. The shift register according to claim 12, wherein the pull-up control circuit comprises an eighth transistor, a ninth transistor, and a second capacitor;
   a gate of the eighth transistor is connected to the second trigger signal end, a first electrode thereof is connected to the low level end, and a second electrode thereof is connected to the pull-up control node;
   a gate of the ninth transistor is connected to the pull-down control node, a first electrode thereof is connected to the low level end, and a second electrode thereof is connected to a first electrode of the second capacitor and the pull-up control node; and
   the first electrode of the second capacitor is connected to the pull-up control node, and a second electrode thereof is connected to the pull-down circuit and the output terminal of the shift register unit.

16. The shift register according to claim 12, wherein the pull-up circuit comprises a tenth transistor,
   wherein a gate of the tenth transistor is connected to the pull-up control node, a first electrode thereof is connected to the output terminal of the shift register unit, and a second electrode thereof is connected to the first clock signal end.

17. The shift register according to claim 12, wherein the pull-down circuit comprises a eleventh transistor, a twelfth transistor, and a thirteenth transistor;
   a gate of the eleventh transistor is connected to the pull-down control node, a first electrode thereof is connected to the low level end, and a second electrode thereof is connected to the output terminal of the shift register unit;
   a gate of the twelfth transistor is connected to the second trigger signal end, a first electrode thereof is connected to the low level end, and a second electrode thereof is connected to a first electrode of the thirteen transistor and the output terminal of the shift register unit; and
   a gate of the thirteenth transistor is connected to the second clock signal end, the first electrode thereof is connected to the output terminal of the shift register unit, and a second electrode thereof is connected to the low level end.

* * * * *